United States Patent
Tsai et al.

(10) Patent No.: US 9,489,024 B2
(45) Date of Patent: Nov. 8, 2016

(54) SERVER RACK SYSTEM

(71) Applicant: AIC INC., Taoyuan Hsien (TW)

(72) Inventors: Kun-Sheng Tsai, Taoyuan Hsien (TW);
Wei-Shih Wu, Taoyuan Hsien (TW);
Yong-Cong Chen, Taoyuan Hsien (TW)

(73) Assignee: AIC INC., Taoyuan Hsien (TW)

( * ) Notice: Subject to any disclaimer, the term of this patent is extended or adjusted under 35 U.S.C. 154(b) by 107 days.

(21) Appl. No.: 14/585,248

(22) Filed: Dec. 30, 2014

(65) Prior Publication Data

US 2016/0187945 A1 Jun. 30, 2016

(51) Int. Cl.
*G06F 1/26* (2006.01)
*H05K 7/14* (2006.01)
*H05K 7/20* (2006.01)

(52) U.S. Cl.
CPC ............... *G06F 1/26* (2013.01); *H05K 7/1492* (2013.01); *H05K 7/20736* (2013.01)

(58) Field of Classification Search
CPC ..... G06F 1/26; H05K 7/1405; H05K 7/1492
See application file for complete search history.

(56) References Cited

U.S. PATENT DOCUMENTS

| 2015/0180234 A1* | 6/2015 | Bailey | H02J 1/10 307/12 |
| 2015/0245531 A1* | 8/2015 | Meinecke | H02M 3/158 361/679.02 |

* cited by examiner

*Primary Examiner* — Albert Wang
(74) *Attorney, Agent, or Firm* — Chun-Ming Shih; HDLA IPR Services

(57) ABSTRACT

A sever rack system includes a rack body, multiple server units, a power control unit and a power supply module. Multiple storage cabinets, a first surface and a second surface are disposed on the rack body. The server units are respectively installed on each storage cabinet and perpendicular to the first surface. Each server unit includes a power socket and each power socket protrudes towards the second surface. The power control unit is installed on one of the storage cabinets and near one side of the server units. The power control unit includes multiple power supplies, a first conductive sheet and a second conductive sheet connected to each power supply. The power supply module includes a first conductive stick, multiple insulation blocks and a second conductive stick. Each insulation block is disposed between the first conductive stick and the second conductive stick for being coupled with the power socket.

12 Claims, 10 Drawing Sheets

SERVER RACK SYSTEM

TECHNICAL FIELD

The disclosure relates to a server, more particularly to a server rack system capable of centralized power supply.

BACKGROUND

A server is the core of each computer in a network system as it can provide a variety of functions, such as serving as a hard disk, and provide print service. Besides, it enables each client to share each other's resources in the network. The basic structure of the server is similar to that of a personal computer which involves a CPU, memory and input/output components, for example. A bus inside the server connect these components, in which a northbridge chip is connected to the CPU and the memory while a southbridge chip is connected to the input/output components.

In server units inside a current rack (e.g. switches, routers, hardware firewalls, hard drive), cables are used to connect each server unit and a power supply module to provide power required to each server unit. As the number of server units increases, the number of cables increases accordingly. This messes the arrangement of the cables and is inconvenient for users to operate. Hence, some rackmount servers dispose the power supply modules in the middle position on the rear of the rack. The power supply modules are disposed on upper and lower sides respectively and are electrically connected to each other. This solves the problem of the power supply module being connected to every server unit. However, this type of power supply module comprises multiple electrical connectors, multiple fixing members and a busbar, and the busbar fixes each electrical connector to a stand of the rack by each fixing member. Additionally, each busbar is fixed to each conductive terminal of the power supply module via the conductive fixing members to ensure that power is transmitted to each server unit.

That is, the current busbar requires the fixing members being connected to each electrical connector in order to be fixed to the stand and also requires the conductive fixing members for being connected to the power supply module. This is time consuming and inconvenient in terms of assembly processes. Therefore, the disclosure intends to introduce an improved design capable of solving the problems mentioned above.

SUMMARY

The goal of the disclosure is to provide a sever rack system without complicated assembly processes and capable of rapid power transmission.

Thus, the disclosure provides a sever rack system comprising a rack body, a plurality of server units, a power control unit and a power supply module. A plurality of storage cabinets, a first surface and a second surface relative to the rack body are disposed on the rack body. The server units are respectively installed on each storage cabinet and perpendicular to the first surface. Each server unit comprises a power socket and each power socket protrudes towards the second surface. The power control unit is installed on one of the storage cabinets and near one side of the server units. The power control unit comprises a plurality of power supplies, a first conductive sheet and a second conductive sheet connected to each of the power supplies. The power supply module comprises a first conductive stick, a plurality of insulation blocks and a second conductive stick. Each of the insulation blocks is disposed between the first conductive stick and the second conductive stick for being coupled with the power socket. The first conductive stick and the second conductive stick are electrically connected to the first conductive sheet and the second conductive sheet, respectively.

In one embodiment, the first conductive stick further comprises a first handle portion and a first plugging portion connected to the first handle portion. The second conductive stick comprises a second handle portion and a second plugging portion connected to the second handle portion. The power supply module further comprises a first insulation material and a second insulation material. The first insulation material is attached to a part of the outer surface of the first handle portion while the second insulation material is attached to a part of the outer surface of the second handle portion. The power supply module further comprises a plurality of fixing members. Each of the fixing members locates the first conductive sheet on one end of the first handle portion and locates the second conductive sheet on one end of the second handle portion.

In one embodiment, a rack system further comprises a plurality of cooling modules. Each of the cooling modules corresponds to the storage cabinets respectively and is disposed on the second surface. Each of the cooling modules has a plurality of fans and a plurality of windshields. Each of the windshields is disposed and corresponds to each of the fans.

Since the power supply module is directly plugged into the power socket of each server unit, complicated fixing processes are not required, which results in rapid assembly processes as well as successful power transmission. The first conductive piece and the second conductive piece are disposed in the first electrode and the second electrode respectively to improve the electrical connection between the power socket and the power supply module. This ensures that power can be transmitted o each server unit reliably. The disclosure further includes multiple cooling modules. Arranging the separator between the server unit and the power control unit, as illustrated before, may avoid airflow interference between the two sections of the cooling module while it is working. This further improves the efficiency of heat dissipation.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Figure 1:
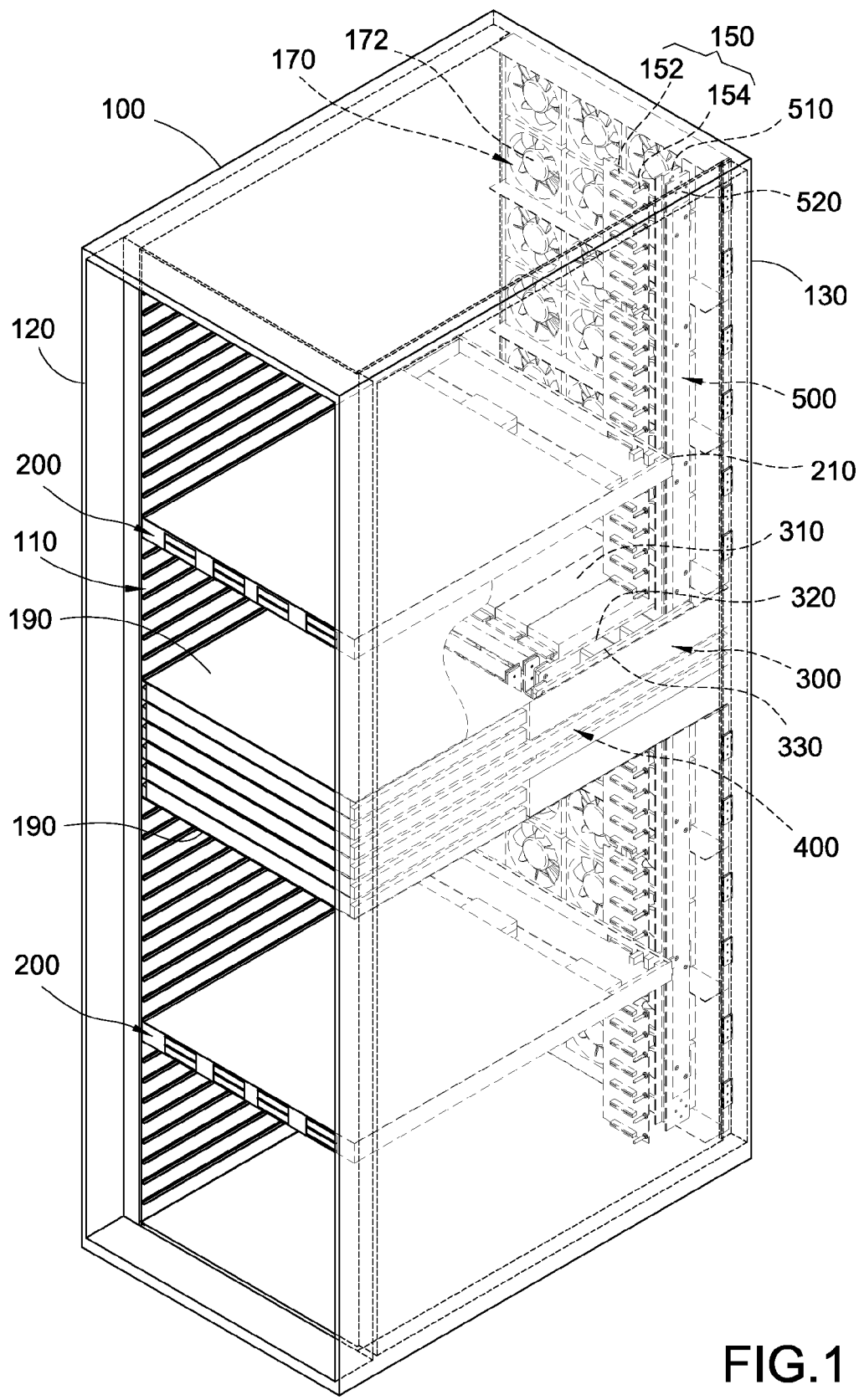
FIG. 1 is a perspective view of a sever rack system of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The disclosure provides a server rack system capable of transmitting power without complicated assembly processes. Preferably, a server unit refers to a file server which is a special computer for other computers to retrieve file and store data. Nevertheless, the server unit in other embodiments may be a database server, an application serve, etc, and the disclosure is not limited thereto.

As shown in FIG. 1, a server rack system of the disclosure comprises a rack body 100, a plurality of server units 200, a power control unit 300 and a power supply module 500. A plurality of storage cabinets 110, a first surface 120 and a second surface 130 relative to the rack body 100 are disposed on the rack body 100. Each server unit 200 is installed on each storage cabinet 110 and perpendicular to the first surface 120. Each server unit 200 comprises a power socket 210 and each power socket 210 protrudes towards the second surface 130. The power control unit 300 is installed on one of the storage cabinets 110 and near one side of the server units 200. The power control unit 300 comprises a plurality of power supplies 310, a first conductive sheet 320 and a second conductive sheet 330. The power supply module 500 comprises a first conductive stick 510, a plurality of insulation blocks 530 and a second conductive stick 520. Each of the insulation blocks 530 is disposed between the first conductive stick 510 and the second conductive stick 520 for being coupled with the power socket 210. The first conductive stick 510 and the second conductive stick 520 are electrically connected to the first conductive sheet 320 and the second conductive sheet 330, respectively.

In FIG. 1, the unit of the height of the rack body 100 is U (1 U=1.75 inch=44.45 mm) while the height of the rack body 100 ranges from 22 U to 48 U. In this embodiment, the height of the rack body 100 is preferably to be 48 U. Two power control units and a CPU 400 are in the middle 6 U while the upper and lower blocks are divided by each power control unit 300. In other words, the upper block and the lower block account for 21 U respectively while one power control unit 300 is disposed on each block to provide power to each server unit 200 correspondingly. The CPU 400 is disposed between each power control unit 300 for controlling data transmission between the upper block and the lower block. Each storage cabinet 110 accounts for 1 U and is with detachable tracks (now shown in the figures) which enables each server unit 200 and each power control unit 300 to be pulled out. It should be noted that only one block will be illustrated in the following content.

Figure 2:
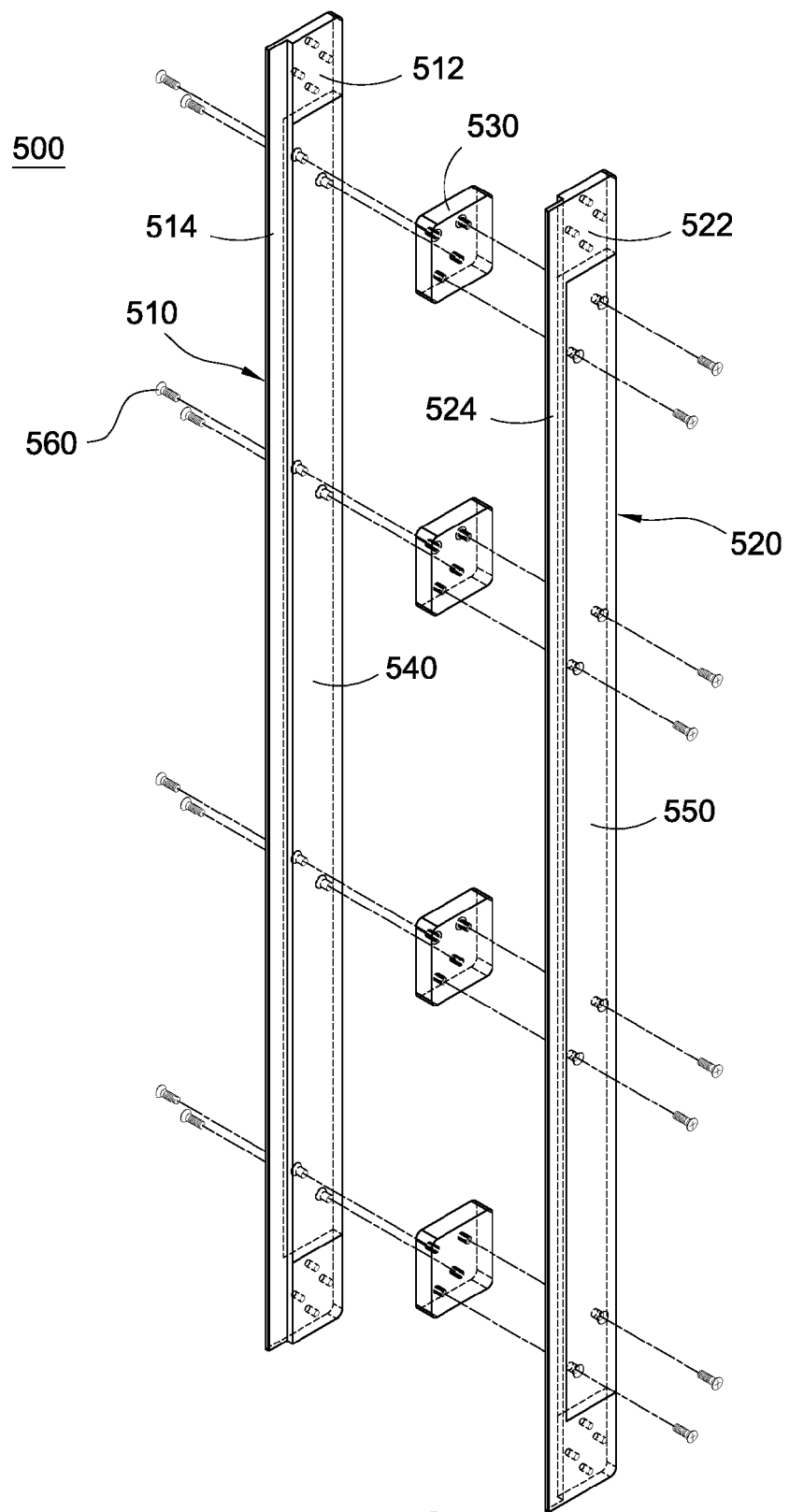
FIG. 2 is an exploded view of a power supply module of the disclosure.

Referring to FIG. 2, the first conductive stick 510 further comprises a first handle portion 512 and a first plugging portion 514 connected to the first handle portion 512, and the second conductive stick 520 comprises a second handle portion 522 and a second plugging portion 524 connected to the second handle portion 522. The materials of the first conductive stick 510 and the second conductive stick 520 is copper, copper alloy or other suitable materials, served as conductors for reducing loss during power transmission. Furthermore, the power supply module 500 further comprises a first insulation material 540 and a second insulation material 550. The first insulation material 540 is attached to a part of the outer surface of the first handle portion 512 while the second insulation material 550 is attached to a part of the outer surface of the second handle portion 522. This prevents users from getting an electric shock when using it. Each of the fixing members 560 goes through the first conductive stick 510 or the second conductive stick 520 and is fixed to each of the insulation blocks 530.

Figure 3:
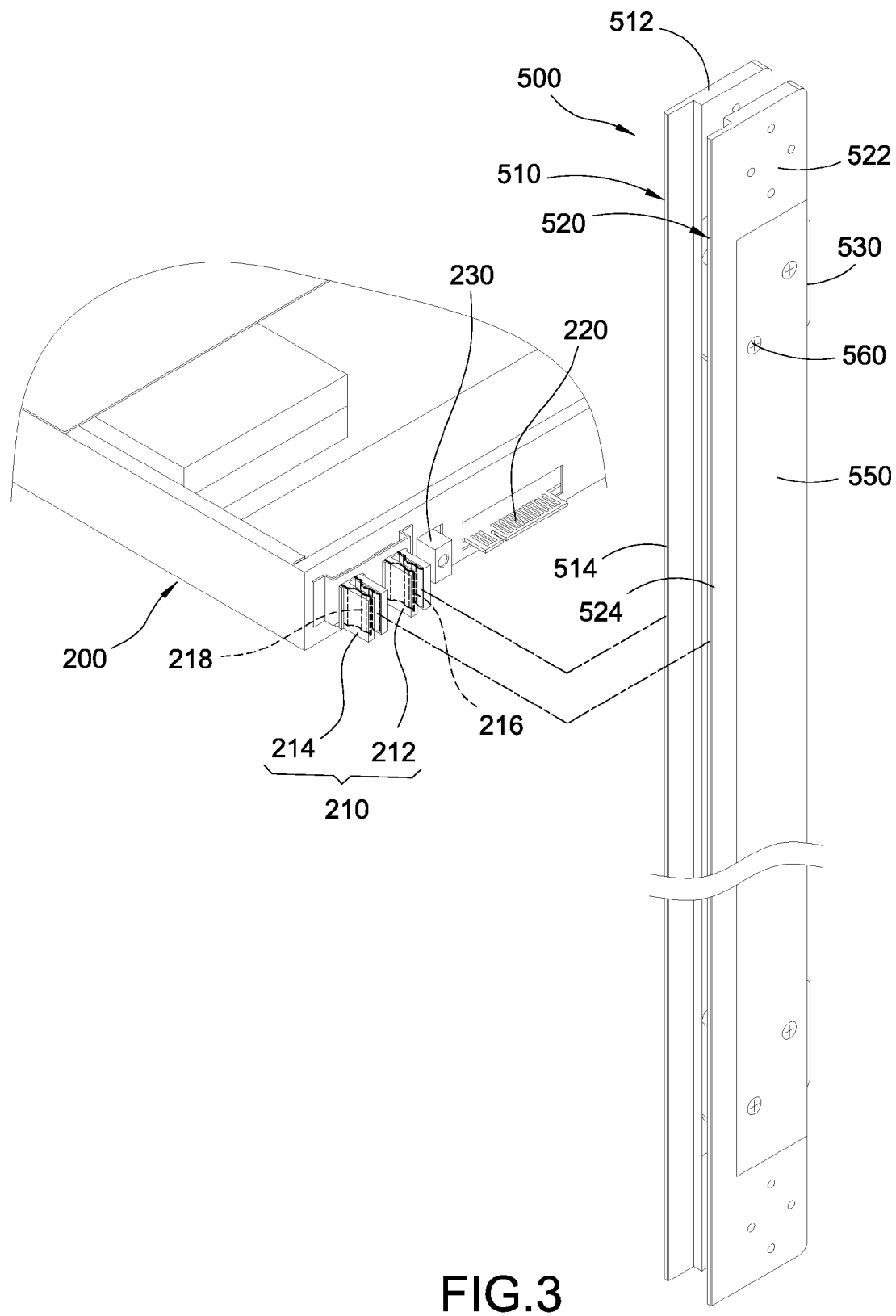
FIG. 3 is an exploded view of the power supply module connected a single server unit according to the disclosure.
Figure 4:
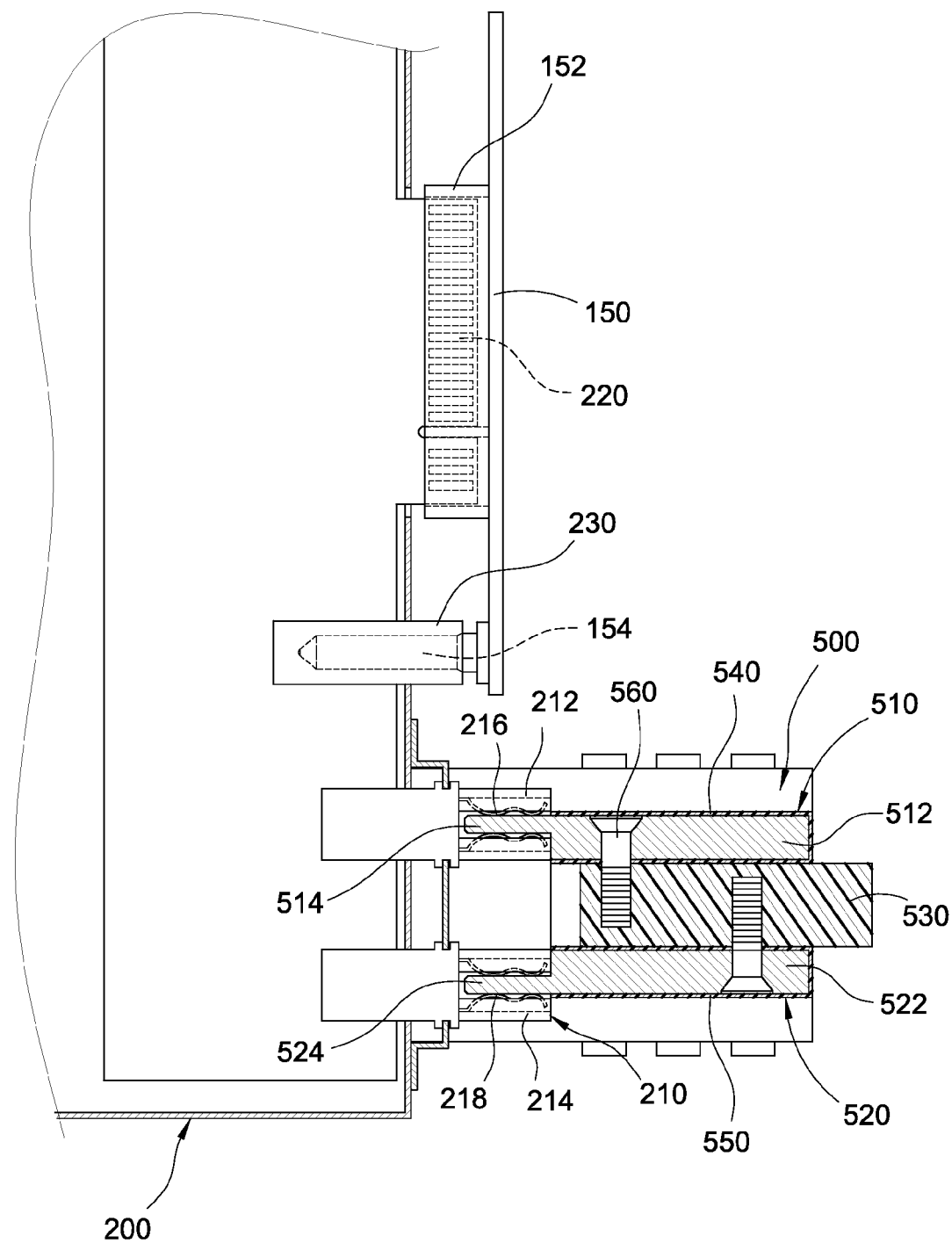
FIG. 4 is a sectional view of the power supply module connected a single server unit according to the disclosure.

Referring to FIG. 1, FIG. 3 and FIG. 4, this embodiment further involves a signal control board 150 installed near the second surface 130. In FIG. 1, the signal control board 150 is preferably to be disposed near the power supply module 500 and both are arranged on the inner side of the second surface 130.

A plurality of signal slots 152 and a plurality of guide sticks 154 are disposed on the signal control board 150. Each of signal slots 152 and each of the guide sticks 154 are disposed and correspond to each of the storage cabinets 110. As seen in FIG. 3 and FIG. 4, each of the server units 200 further comprises a signal plug 220 and a guide groove 230. Each of the signal plugs 220 and each of the guide grooves 230 are disposed parallel to each of the power sockets 210 and are plugged into each of the signal slots 152 and each of the guide sticks 154, respectively. Each signal plug 220 is preferably to be a circuit board whose shape is similar to a plate, for transmitting data or signals. Each guide stick 154 is configured for guiding and ensuring the locations of each server unit 200.

In the embodiment shown in FIG. 3 and FIG. 4, each of the power sockets 210 comprises a pair of first electrodes 212 and a pair of second electrodes 214. The first conductive stick 510 is for the pair of first electrodes 212 to be electrically connected to while the second conductive stick 520 is for the pair of second electrodes 214 to be electrically connected to. Moreover, the power socket 210 further comprises a pair of first conductive pieces 216 and a pair of second conductive pieces 218. The pair of first conductive pieces 216 are disposed in the pair of first electrodes 212 respectively to elastically clip the first conductive stick 510, while the pair of second conductive pieces 218 are disposed in the pair of second electrodes 214 respectively to elastically clip the second conductive stick 520. Since the first conductive piece 216 and the second conductive piece 218 are disposed in the first electrode 212 and the second electrode 214, the electrical connection between the power socket 210 and the power supply module 500 is enhanced. This ensures that power can be transmitted to each server unit 200 reliably.

Figure 5:
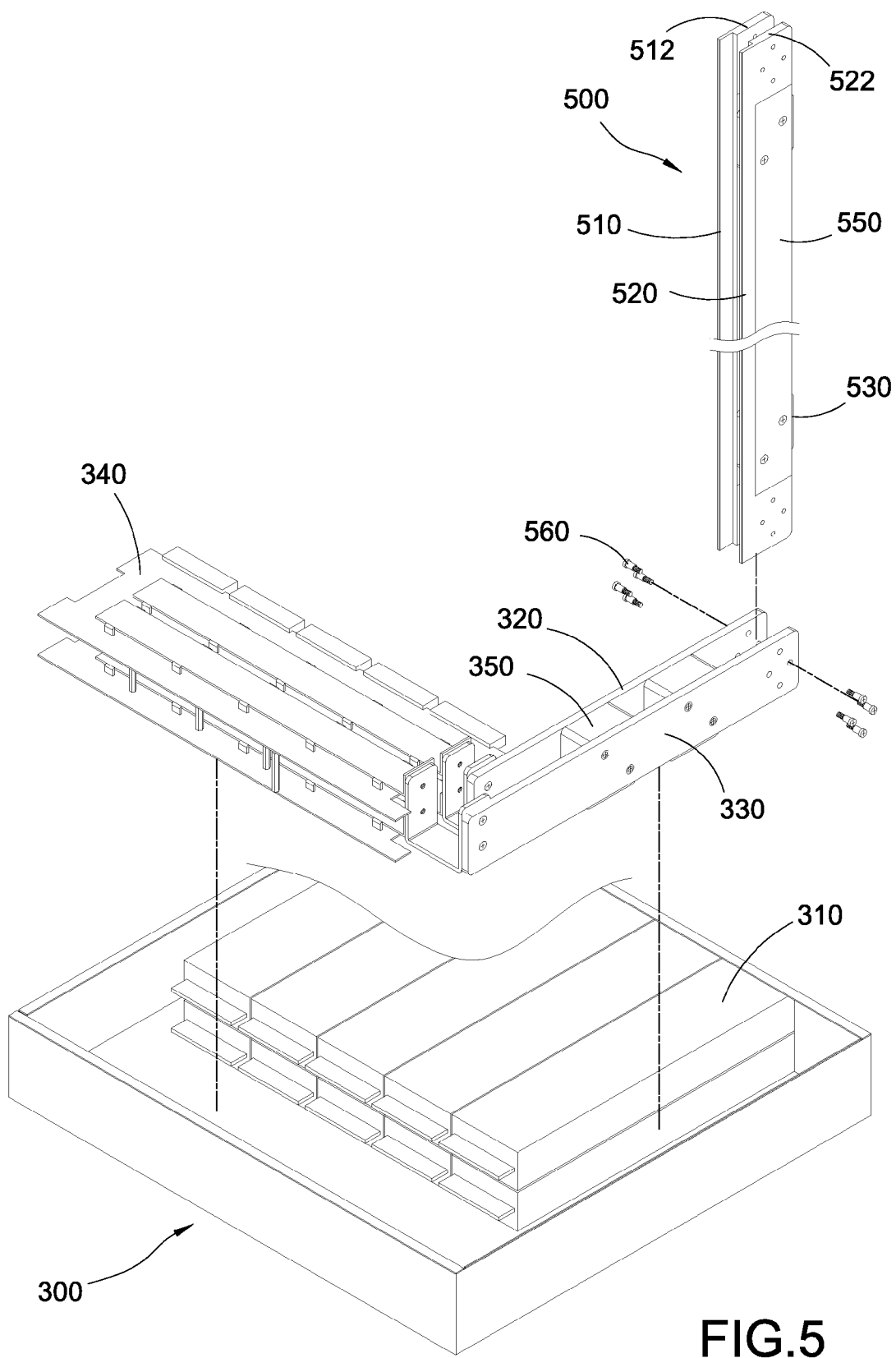
FIG. 5 is a perspective view of the power supply module connected to a power control unit according to the disclosure.

Referring to FIG. 5, the power control unit 300 is preferably to be placed in the middle position of the rack body 100, for providing power to the server unit 200 in one of the blocks (e.g. upper block as shown in FIG. 1). In addition to the power supplier 310 and the circuit board 340 connected to the power supplier which are disposed on the power control unit 300 near the second surface 130, the power control unit 300 further comprises a plurality of network switches near the first surface 120 (not shown in the figures). Based on different polarities, the circuit board 340 is connected to the first conductive sheet 320 and the second conductive sheet 330 respectively. A plurality of insulation blocks 350 is disposed between the first conductive sheet 320 and the second conductive sheet 330 to avoid short circuit occurring between the two conductive sheets 320 and 330. Therefore, the first conductive sheet 320 is electrically connected to the first conducive stick 510 while the second conductive sheet 330 is electrically connected to the second conductive stock 520. As seen in FIG. 5, each fixing member 560 locates the first conductive sheet 320 to one end of the first handle portion 512 and locates the second conductive sheet 330 to one end of the second handle portion 522. The materials of the first conductive sheet 320 and the second conductive sheet 330 is copper, copper alloy or other suitable materials, for reducing loss during power transmission.

Figure 6:
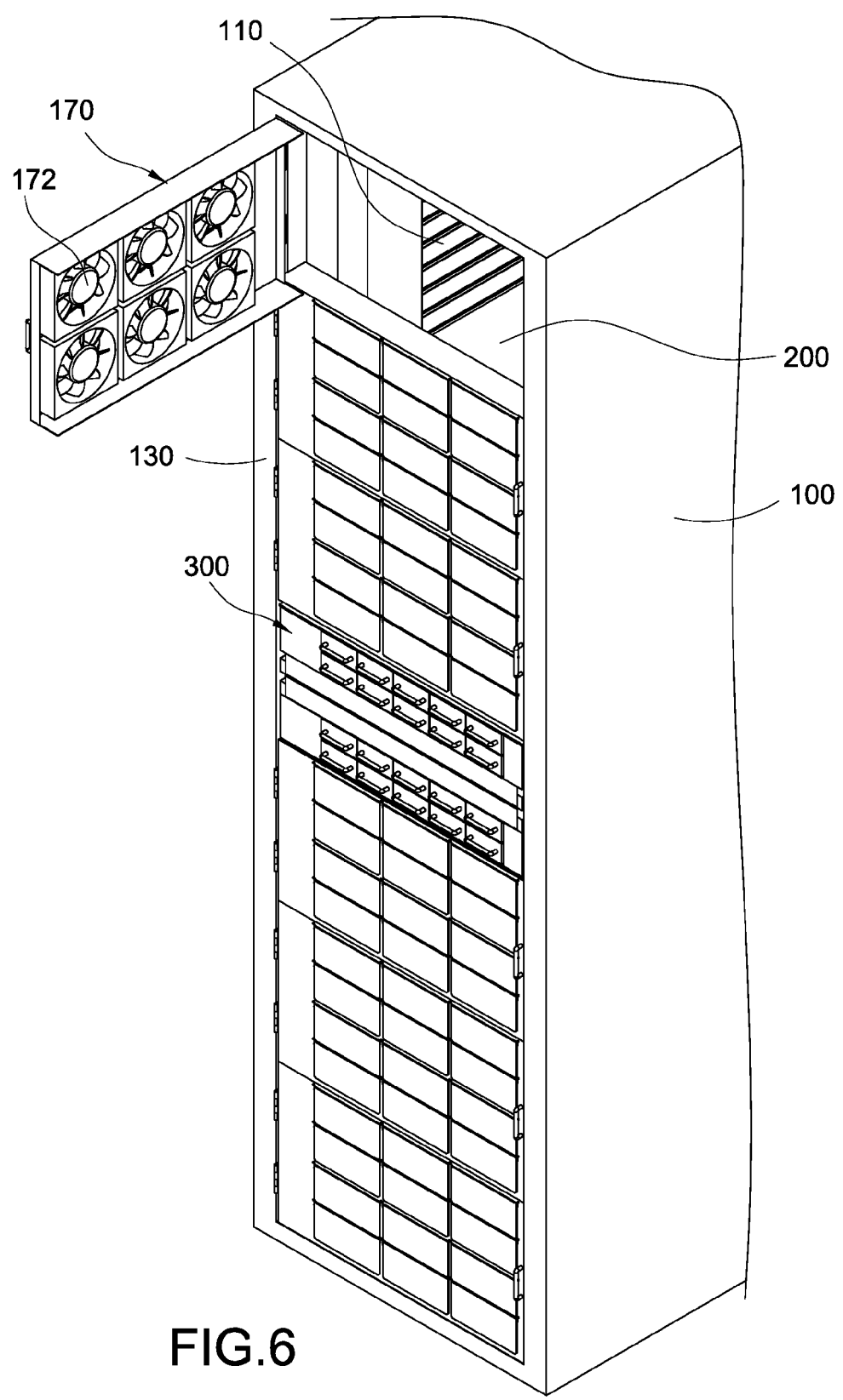
FIG. 6 is a perspective view of a cooling module disposed on a second surface of a rack body according to the disclosure.
Figure 7:
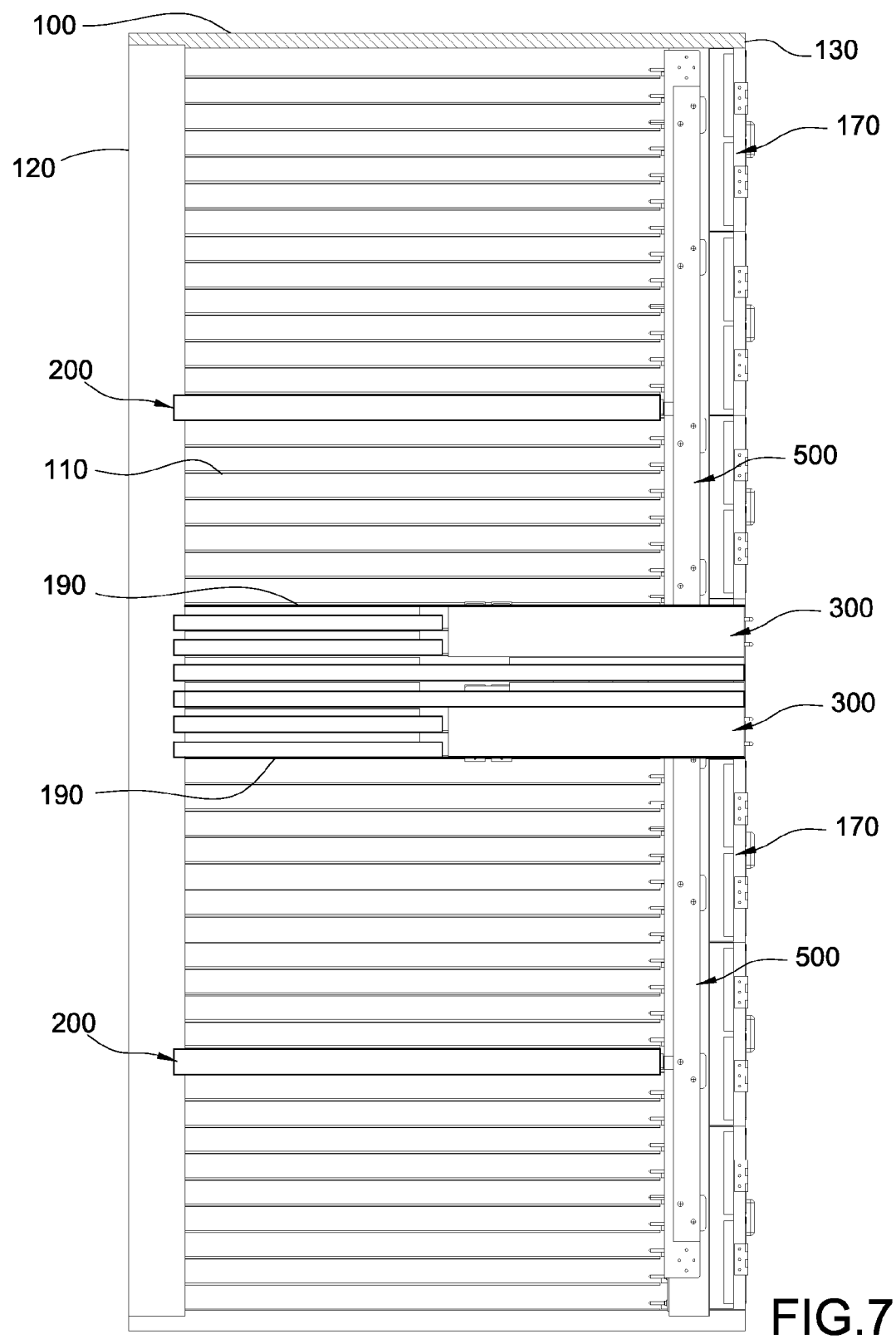
FIG. 7 is a lateral view of a separator of the disclosure.
Figure 10:
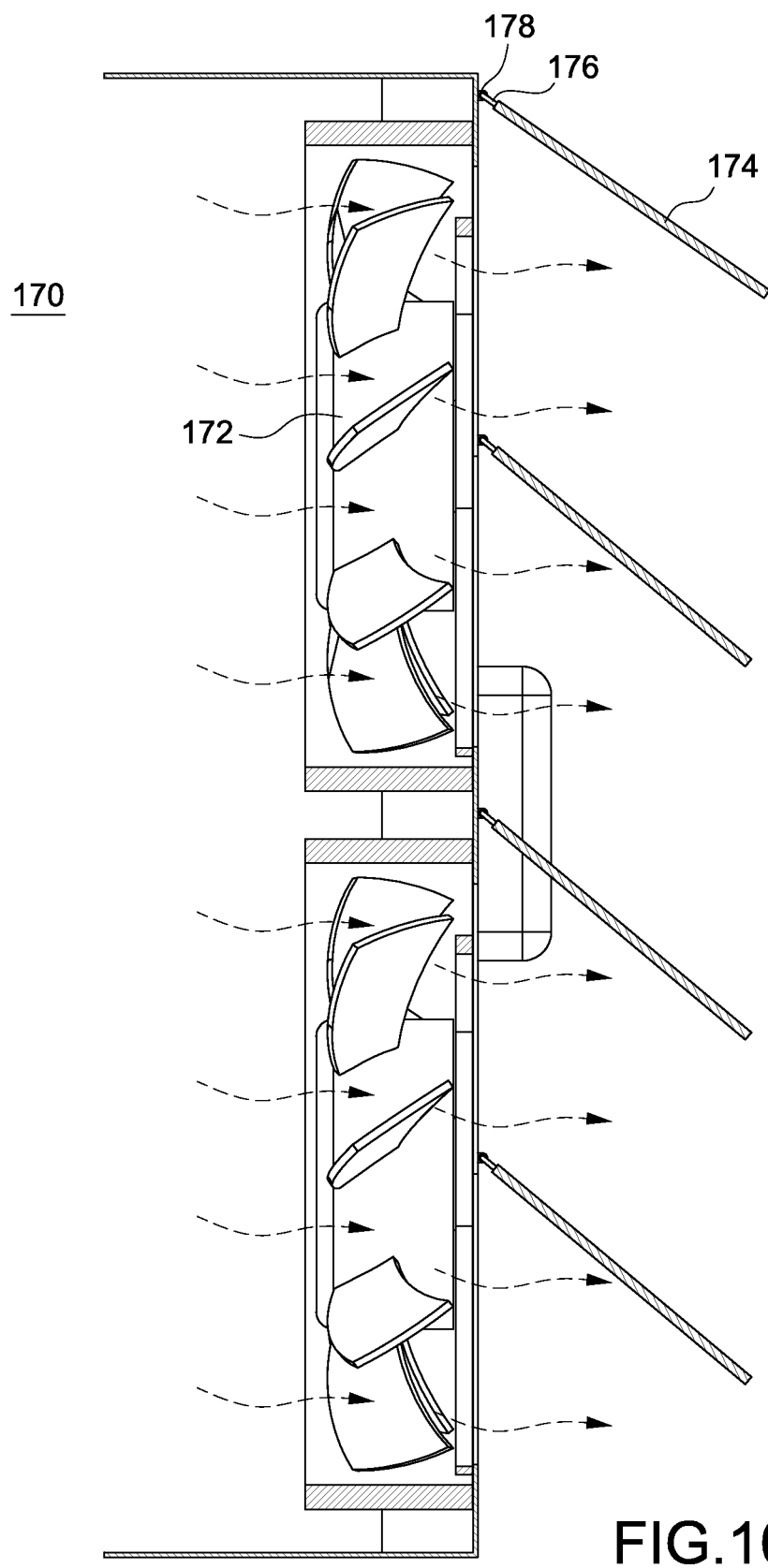
FIG. 10 is a schematic view of the movement of the operation of the cooling module according to the disclosure.

As shown in FIG. 6 and FIG. 7, the sever rack system in this embodiment further comprises a plurality of cooling modules 170. Each of the cooling modules 170 corresponds to the storage cabinets 110 respectively and is disposed on the second surface 130. Each of the cooling modules 170 has a plurality of fans 172 and a plurality of windshields 174. Each of the windshields 174 is disposed in a way that it corresponds to each of the fans 172. In the embodiment in FIG. 6, a single cooling module 170 accounts for 7 U which is seven server units 200. Six backflow fans are disposed on the cooling module 170 which indicates eighteen backflow fans are disposed on the upper block 21U. As seen in FIG. 7, two separators 190 are disposed on the rack body 100 and are disposed between the server unit 200 and the power control unit 300. This avoids airflow interference among two sections in the cooling module 170 and therefore improves the efficiency of heat dissipation (as seen in FIG. 10).

Figure 8:
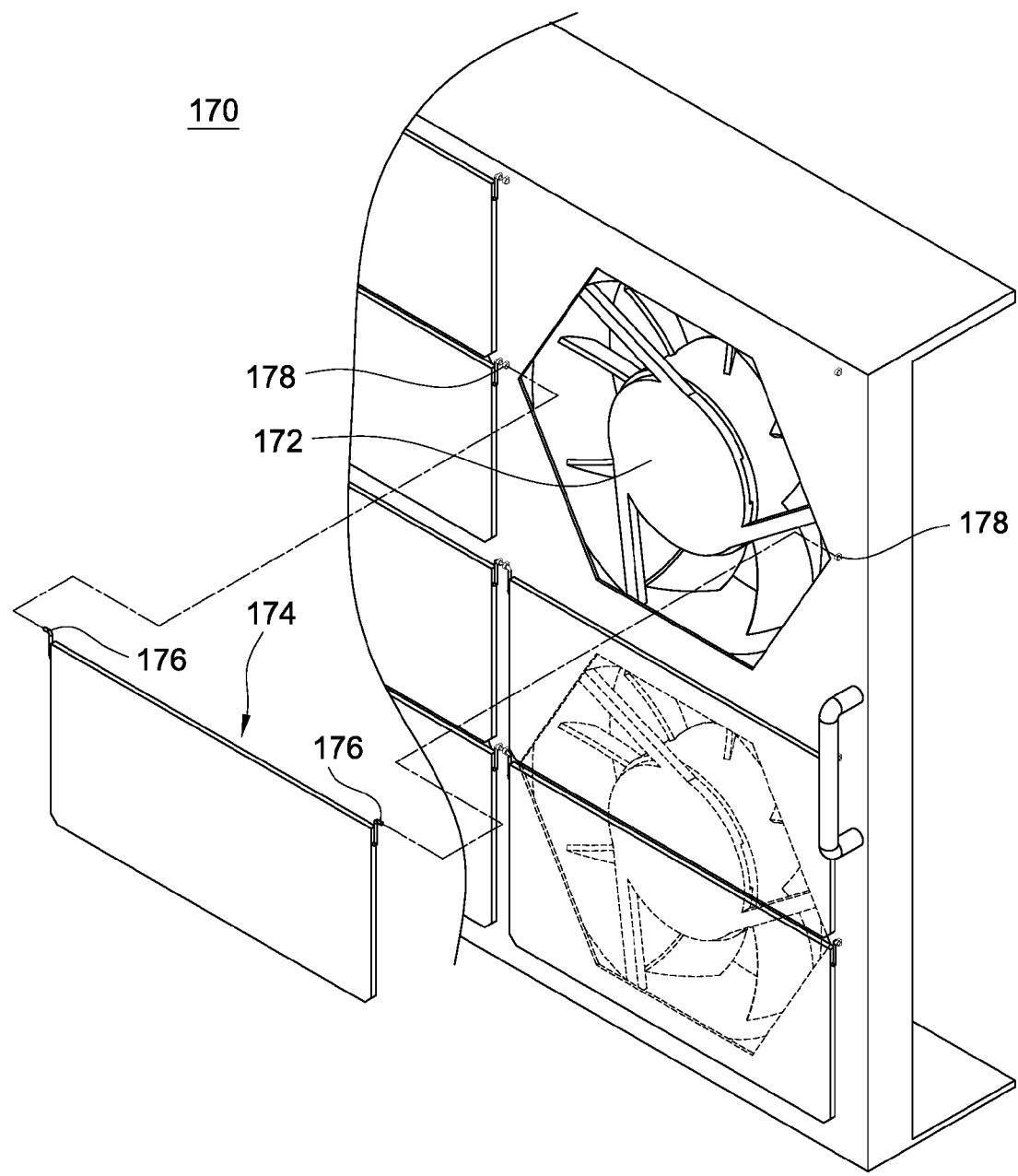
FIG. 8 is an exploded view of windshields and fans of the cooling module according to the disclosure.
Figure 9:
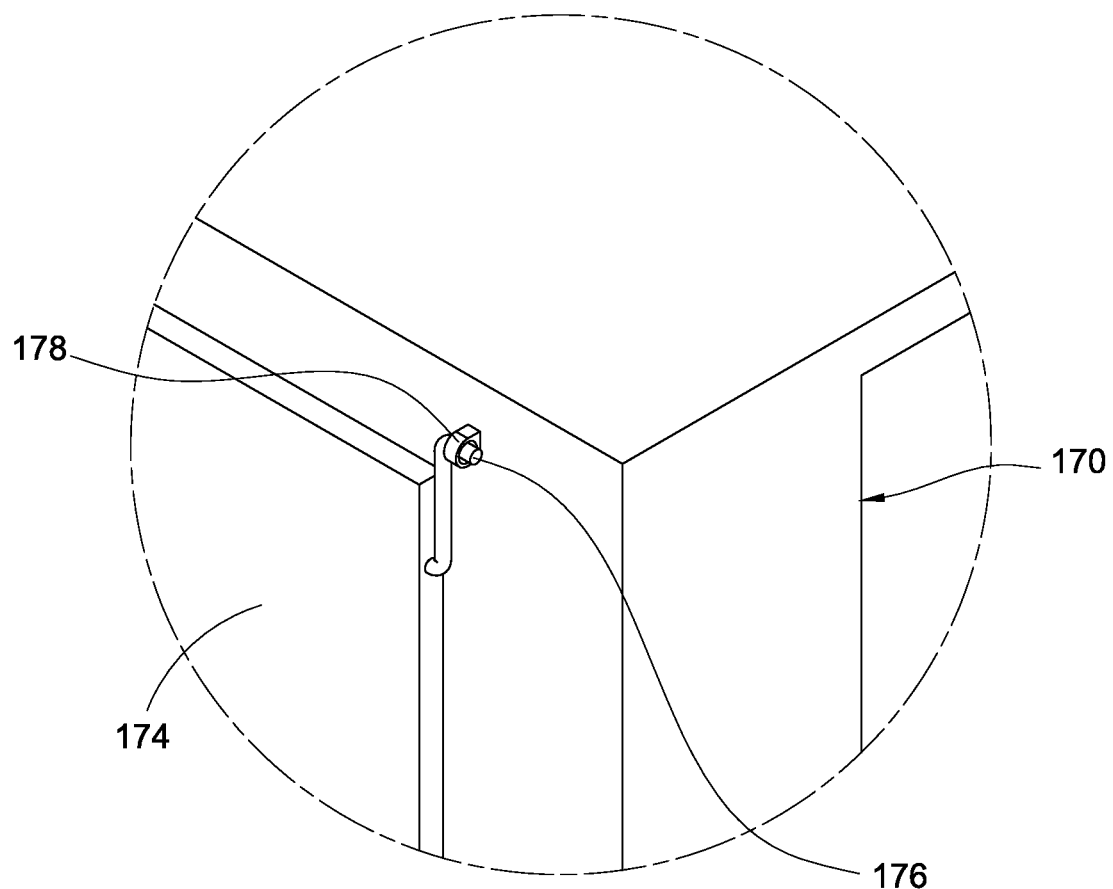
FIG. 9 is a partial enlarged view of FIG. 8.

Referring to FIG. 8 to FIG. 9, one side of each windshield 174 has two stands 176. The two stands 176 are disposed on two ends of the windshield 174 respectively. The cooling module 170 further comprises a plurality of installation holes 178. Each of the installation holes 178 corresponds to each of the stands 176 for locating the windshield 174 on a main body of the cooling module 170. Referring to FIG. 10, when the fans 172 of each cooling module 170 are working, heat is transferred along a direction towards the windshield 174. Thereby, the windshield 174 rotates around the stand 176 as an axis because of the wind. When each cooling module 170 stops working, the windshield 174 may avoid dust and turbulence.

What is claimed is:

1. A server rack system, comprising:
    a rack body (100), wherein a plurality of storage cabinets (110), a first surface (120) and a second surface (130) relative to the rack body (100) are disposed on the rack body (100);
    a plurality of server units (200) respectively installed on each storage cabinet (110) and perpendicular to the first surface (120), wherein each server unit (200) comprises a power socket (210) protruding towards the second surface (130);
    a power control unit (300) installed on one of the storage cabinets (110) and near one side of the server units (200), wherein the power control unit (300) comprises a plurality of power supplies (310), a first conductive sheet (320) and a second conductive sheet (330) connected to each of the power supplies (310); and
    a power supply module (500) comprising a first conductive stick (510), a plurality of insulation blocks (530) and a second conductive stick (520), wherein each of the insulation blocks (530) is disposed between the first conductive stick (510) and the second conductive stick (520), and the power socket (210) includes a pair of first electrodes (212) and a pair of second electrodes (214) for coupling with the first conductive stick (510) and the second conductive stick (520), respectively,
    wherein the first conductive stick (510) and the second conductive stick (520) are electrically connected to the first conductive sheet (320) and the second conductive sheet (330), respectively;
    wherein one end of the first conductive stick (510) and one end of the second conductive stick (520) are located between the first conductive sheet (320) and the second conductive sheet (330).

2. The server rack system according to claim 1, wherein the first conductive stick (510) further comprises a first handle portion (512) and a first plugging portion (514) connected to the first handle portion (512), and the second conductive stick (520) comprises a second handle portion (522) and a second plugging portion (524) connected to the second handle portion (522).

3. The server rack system according to claim 2, wherein the power supply module (500) further comprises a first insulation material (540) and a second insulation material (550), the first insulation material (540) is attached to a part of the outer surface of the first handle portion (412) while the second insulation material (550) is attached to a part of the outer surface of the second handle portion (522).

4. The server rack system according to claim 2, wherein the power supply module (500) further comprises a plurality of fixing members (560), each of the fixing members (560) locates the first conductive sheet (320) on one end of the first handle portion (512) and locates the second conductive sheet (330) on one end of the second handle portion (522).

5. The server rack system according to claim 1, wherein the first conductive stick (510) is for the pair of first electrodes (212) to be electrically connected to while the second conductive stick (520) is for the pair of second electrodes (214) to be electrically connected to.

6. The server rack system according to claim 5, wherein the power socket (210) further comprises a pair of first conductive pieces (216) and a pair of second conductive pieces (218), the pair of first conductive pieces (216) are disposed in the pair of first electrodes (212) respectively to elastically clip the first conductive stick (510), while the pair of second conductive pieces (218) are disposed in the pair of second electrodes (214) respectively to elastically clip the second conductive stick (520).

7. The server rack system according to claim 1, wherein the power supply module (500) further comprises a plurality of fixing members (560), each of the fixing members (560) goes through the first conductive stick (510) or the second conductive stick (520) to be fixed to each of the insulation blocks (530).

8. The server rack system according to claim 1, further comprising a signal control board (150) set near the second surface (130), wherein a plurality of signal slots (152) and a plurality of guide sticks (154) are disposed on the signal control board (150) while each of the signal slots (152) and each of the guide sticks (154) is disposed and corresponds to each of the storage cabinets (110).

9. The server rack system according to claim 8, wherein each of the server units (200) further comprises a signal plug (220) and a guide groove (230), each of the signal plugs (220) and each of the guide grooves (230) are disposed parallel to each of the power sockets (210) and are plugged into each of the signal slots (152) and each of the guide sticks (154) respectively.

10. The server rack system according to claim 1, further comprising a plurality of cooling modules (170), wherein each of the cooling modules (170) corresponds to the storage cabinets (110) respectively and is disposed on the second surface (130), each of the cooling modules (170) has a plurality of fans (172) and a plurality of windshields (174), each of the windshields (174) is disposed and corresponds to each of the fans (172).

11. The server rack system according to claim 10, wherein one side of each windshield (174) has two stands (176), the two stands (176) are disposed on two ends of the windshield (174) respectively, the cooling module (170) further comprises a plurality of installation holes (178), and each of the installation holes (178) corresponds to each of the stands (176) for locating the windshield (174) on a main body of the cooling module (170).

12. The server rack system according to claim 10, wherein at least one separator (190) is disposed on the rack body (100) and is disposed between the server unit (200) and the power control unit (300).

* * * * *